US012314162B2

United States Patent
Fuller et al.

(10) Patent No.: US 12,314,162 B2
(45) Date of Patent: May 27, 2025

(54) CIRCUITS AND METHODS FOR SELF-ADAPTIVE DECISION-FEEDBACK EQUALIZATION IN A MEMORY SYSTEM

(71) Applicant: Rambus Inc., San Jose, CA (US)

(72) Inventors: Andrew M. Fuller, Durham, NC (US); Barry William Daly, Chapel Hill, NC (US); Thomas J. Giovannini, San Jose, CA (US); Lei Luo, Chapel Hill, NC (US); Masum Hossain, Edmonton (CA)

(73) Assignee: Rambus Inc., San Jose, CA (US)

( * ) Notice: Subject to any disclaimer, the term of this patent is extended or adjusted under 35 U.S.C. 154(b) by 74 days.

(21) Appl. No.: 18/162,824

(22) PCT Filed: Aug. 6, 2021

(86) PCT No.: PCT/US2021/044932
§ 371 (c)(1),
(2) Date: Feb. 1, 2023

(87) PCT Pub. No.: WO2022/039945
PCT Pub. Date: Feb. 24, 2022

(65) Prior Publication Data
US 2024/0168873 A1 May 23, 2024

Related U.S. Application Data

(60) Provisional application No. 63/067,716, filed on Aug. 19, 2020.

(51) Int. Cl.
*G06F 12/02* (2006.01)
*G11C 11/408* (2006.01)

(52) U.S. Cl.
CPC ...... *G06F 12/0223* (2013.01); *G11C 11/4082* (2013.01)

(58) Field of Classification Search
CPC ............ G06F 12/0223; G11C 11/4082; G11C 7/1048; G11C 7/1012; G11C 7/1087; H04L 25/03267; H04L 25/063; H04L 25/03057
See application file for complete search history.

(56) References Cited

U.S. PATENT DOCUMENTS

| | | | | |
|---|---|---|---|---|
| 6,130,943 A | * | 10/2000 | Hardy | H04B 3/21 370/291 |
| 6,356,487 B1 | * | 3/2002 | Merritt | G11C 7/1006 365/189.05 |

(Continued)

FOREIGN PATENT DOCUMENTS

WO    WO-2017023508 A1    2/2017

OTHER PUBLICATIONS

Notification of Transmittal of the International Search Report and the Written Opinion of the International Searching Authority, or the Declaration with Mail Date Nov. 3, 2021 re: Int'l Appln. No. PCT/US2021/044932. 7 pages.

(Continued)

*Primary Examiner* — Sophia Vlahos
(74) *Attorney, Agent, or Firm* — Silicon Edge Law Group LLP; Arthur J. Behiel

(57) ABSTRACT

Described are integrated circuits for equalizing parallel write-data and address signals from a memory controller. The integrated circuits each include a set of decision-feedback equalizers, one equalizer for each received signal. Each equalizer in a set has a main sampler and a monitor sampler, each of which samples the respective input signal on edges of a timing-reference signal (e.g. a clock or strobe) that is common to the set. The main sampler samples the input signal relative to a reference. The monitor sampler samples the input signal relative to an adjustable threshold calibrated to monitor one or more levels of the input signal.

(Continued)

A feedback network adjusts the respective input signal responsive to one or more tap values that can be adjusted to equalize the signal. An adaptive tap-value generator for one or a collection of the equalizers adjusts the tap value or values as a function of least-mean squares of errors to one or more of the sampler input ports.

18 Claims, 6 Drawing Sheets

(56) References Cited

U.S. PATENT DOCUMENTS

| | | | |
|---|---|---|---|
| 7,940,839 B2* | 5/2011 | Lapointe | H04L 25/0307 |
| | | | 375/232 |
| 8,416,846 B1 | 4/2013 | Lin et al. | |
| 8,416,898 B1 | 4/2013 | Luo et al. | |
| 9,384,152 B2 | 7/2016 | Best et al. | |
| 9,680,436 B1* | 6/2017 | Malhotra | H04L 25/03057 |
| 10,135,647 B2 | 11/2018 | Zerbe et al. | |
| 10,560,291 B2 | 2/2020 | Lee et al. | |
| 10,686,632 B2 | 5/2020 | Zerbe et al. | |
| 10,693,686 B2 | 6/2020 | Shi et al. | |
| 2003/0138038 A1* | 7/2003 | Greiss | H04L 25/14 |
| | | | 375/232 |
| 2011/0249774 A1* | 10/2011 | Thakkar | H04L 7/0087 |
| | | | 375/316 |
| 2012/0063242 A1 | 3/2012 | Kim et al. | |
| 2014/0146867 A1* | 5/2014 | Shvydun | H04L 25/03885 |
| | | | 375/233 |
| 2017/0005841 A1* | 1/2017 | Komori | H04L 1/0643 |
| 2018/0136866 A1 | 5/2018 | Eugenio et al. | |
| 2019/0095308 A1 | 3/2019 | Morris | |
| 2020/0076652 A1* | 3/2020 | Shi | G06F 13/1689 |
| 2021/0182223 A1* | 6/2021 | Choi | G11C 7/1051 |

OTHER PUBLICATIONS

Stojanovic, Vladimir et al., "Adaptive equalization and data recovery in a dual-mode (PAM2/4) serial link transceiver," 2004 Symposium on VLSI Circuits. Digest of Technical Papers (IEEE Cat. No.04CH37525), Honolulu, HI, USA, 2004, pp. 348-351, doi: 10.1109/VLSIC.2004.1346611. 4 pages.
Technalysis, "High Speed Memory Interface Chipsets Let Server Performance Fly", TECHnalysis Research LLC 2015, 5 pages.
Wikipedia, "DDR5 SDRAM", last edited Oct. 15, 2020, 6 pages.
Ricky Yuen, "A 6GBPS Transmitter With ISI and Reflection", [Masters Thesis, University of Toronto], 2005, 90 pages.
Wikipedia, "Least mean squares filter", last edited Aug. 26, 2020, 6 pages.
EP Extended European Search Report with Mail Date Oct. 1, 2024 re: EP Appln. No. 21858815.0. 11 pages.

* cited by examiner

CIRCUITS AND METHODS FOR SELF-ADAPTIVE DECISION-FEEDBACK EQUALIZATION IN A MEMORY SYSTEM

BACKGROUND

Memory controllers are digital circuits that manage the flow of data to and from a computer's main memory. A memory controller can be implemented as a special-purpose integrated circuit (IC), or can be integrated with a general-purpose IC, e.g. a control processing unit (CPU). Main memory, typically implemented using memory components with arrays of dynamic random-access memory (DRAM), can likewise be implemented as a special-purpose IC, or integrated with other functionality.

Computer memory systems are commonly synchronous, which means that digital signals (streams of data, control, and address symbols) conveyed between a controller component and a memory component are transmitted from one component on periodic edges of a clock signal and sampled by the other component on edges of the same clock signal.

The maximum signaling rate for systems that employ a shared clock signal is limited because signal transmission delays alter the timing of clock edges relative to the symbols they are meant to sample. Complicating this problem, symbol and clock-edge timing change with temperature and supply voltage. Some memory systems therefore forego the shared clock signal in favor of a timing reference that is forwarded with the symbols to be sampled. The timing reference and symbols experience the same delay and thus arrive at their destinations in temporal alignment.

Each symbol transmitted between components represents a digital value and changing patterns of symbols represent the information to be shared. Different symbol patterns are expressed as different frequencies. For example, the binary symbol stream representing a pattern of alternating ones and zeros (e.g. 01010101) changes at twice the rate (has twice the frequency) as a symbol stream representing a pattern of alternating pairs of ones and zeros (e.g. 00110011). Memory channels tend to attenuate signals as a function of frequency, with higher frequencies generally experiencing more attenuation. This attenuation produces a frequency dependent temporal spreading of symbols and concomitant inter-symbol interference (ISI) that can render symbols unintelligible. Memory channels also exhibit impedance discontinuities that induce signal reflections that likewise interfere with symbols.

Some memory components have integrated equalizers that offset the effects of ISI, and thus support improved signal rates. One such equalizer, the Decision Feedback Equalizer (DFE), stores one or more decisions resolving prior symbol values ("taps"). Knowing the level of ISI imposed by a given value of a given tap, the DFE subtracts that ISI from the incoming signal to cancel the ISI. Knowledge of the level of ISI for a given tap is reflected in a "tap value," a weighting coefficient multiplied by the tap for application to the input signal. The weighting coefficients for a given signal path can be derived from the frequency response of the path and related transmit and receive circuitry.

BRIEF DESCRIPTION OF THE FIGURES

The present disclosure is illustrated by way of example, and not by way of limitation, in the figures of the accompanying drawings. For elements with numerical designations the first digit indicates the figure in which the element is introduced, and like references refer to similar elements within and between figures.

DETAILED DESCRIPTION

Figure 1A:
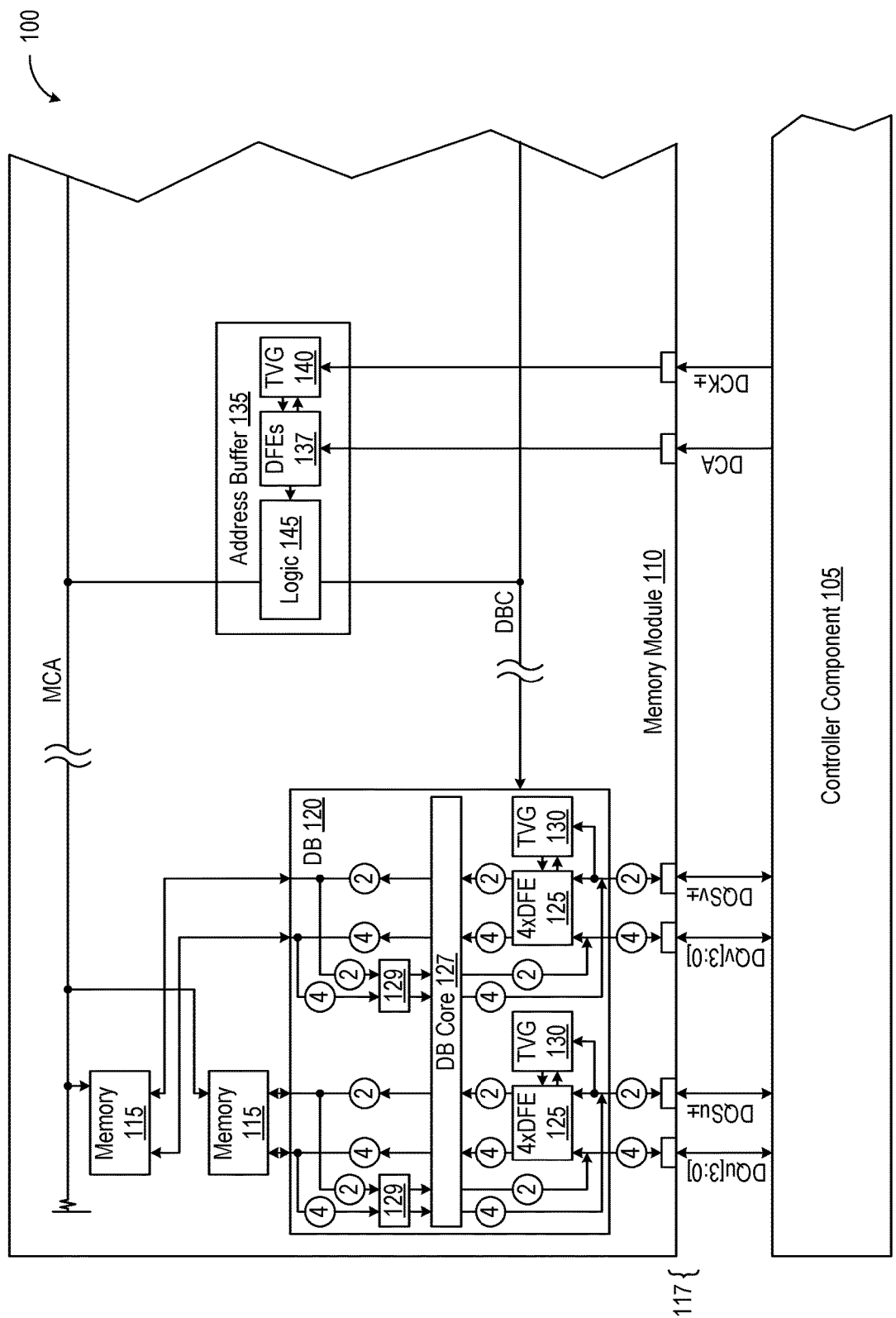
FIG. 1A depicts a memory system 100 in which a controller component 105 issues address and control signals to a memory module 110 to manage the flow of read and write data to and from a collection of memory components 115.

FIG. 1A depicts a memory system 100 in which a controller component 105 issues address and control signals to a memory module 110 to manage the flow of read and write data to and from a collection of memory components 115. Controller component 105 issues complementary strobe signals DQSu± and DQSv± as timing-reference signals that accompany respective parallel, single-ended data signals DQu[3:0] and DQv[3:0] to a module connector 117. Component 105 also provides a shared clock signal DCK±, likewise complementary in this embodiment, as a separate timing reference for command and address signals DCA. A data buffer 120 that manages the communication of data between controller component 105 and memory components 115 includes parallel decision-feedback equalizers (DFEs) 125 for sampling incoming data symbols and adaptive tap-value generators (TVGs) 130 that derive tap values for DFEs 125 based on the frequency response of the data signal paths. DFEs 125 forward data and timing signals to memory paths 115 via data-buffer core logic 127. Memory interfaces 129, optionally including equalization circuitry, manage the flow of read data from memory components 115 to core logic 127 and, ultimately, to controller component 105.

An address buffer 135 manages the communication of command and address signals between controller component 105 and memory components 115. Like the data buffers, address buffer 135 includes parallel DFEs 137 for sampling incoming control and address symbols and adaptive tap-value generators 140 that derive tap values for DFEs 137 based on the frequency response of the command and address signal paths. Address buffer 135 includes logic 145 that interprets signals from controller component 105, via DFEs 137, to issue memory-side command and address signals MCA to memory components 115, and thus to manage the flow of read and write data from and two memory components 115. Logic 145 also issues data-buffer control signals DBC that direct the movement of read and write data through data buffer 120. Data buffer 120 and address buffer 135 compensate for signal deterioration using specialized interface circuitry that can otherwise be incorporated into memory components 115 in other embodiments.

Tap-value generators 130 and 140 are used to calibrate DFEs 125 and 137. To accomplish this calibration, controller component 105 can issue in-band instructions to address buffer 135 via control port DCA or via a sideband communication port (not shown) provided for this purpose. Address buffer 135 employs tap-value generator 140 to calibrate DFEs 137 for receipt of command and address signals received over parallel bus DCA timed to a command-and-address timing signal DCK±, a clock signal rather than a strobe signal in this example. Address buffer 135, once calibrated, instructs data buffer 120 to prepare to receive data (e.g., to enable write buffers, otherwise off to save power). Controller component 105 begins transmitting training data, such as pseudorandom binary sequences (PRBSs), via link groups DQu[3:0] and DQv[3:0] with accompanying data-timing signals, strobe signals DQSu± and DQSv± in this embodiment. Tap-value generators 130 use this information to calibrate DFEs 125 for high-speed receipt of write data. A calibration process for one embodiment is detailed below in connection with FIG. 2.

In the write direction, with the data and address buffers calibrated, controller component 105 directs command, address, and clock signals on primary ports DCA and DCK± to address buffer 135, which responsively issues command and address signals MCA to memory components 115 and control signals DBC to data buffer 120 to prepare for the receipt of write data. Controller component 105 sends the data to data buffer 120 via two groups of four data links DQu[3:0] and DQv[3:0], each with an accompanying data strobe DQSu± and DQSv±, one link group for each memory component 115. Address-buffer component 135, alternatively called a "Registering Clock Driver" (RCD), interprets control signals (e.g., commands, addresses, and chip-select signals) received in parallel on port DCA and communicates appropriate command, address, chip-select, and clock signals to memory components 115 (e.g. DRAM packages or dies) via a secondary control interface MCA. Addresses associated with the commands on primary port DCA identify target collections of memory cells (not shown) in components 115 and chip-select signals associated with the commands allow address-buffer component 135 to select individual integrated-circuit DRAM dies, or "chips," for both access and power-state management.

Data-buffer components 120 and address-buffer component 135 each act as a signal buffer to reduce loading on module connector 117. This reduced loading is in large part because each buffer component presents a single load in lieu of the multiple memory components 115 each buffer component serves. Memory interfaces 129 can include DFEs and tap-value generators similar to those for receipt of write data from controller component 105. Core logic 127 manages the flow of signals through DB 120 as directed by address buffer 135.

Figure 1B:
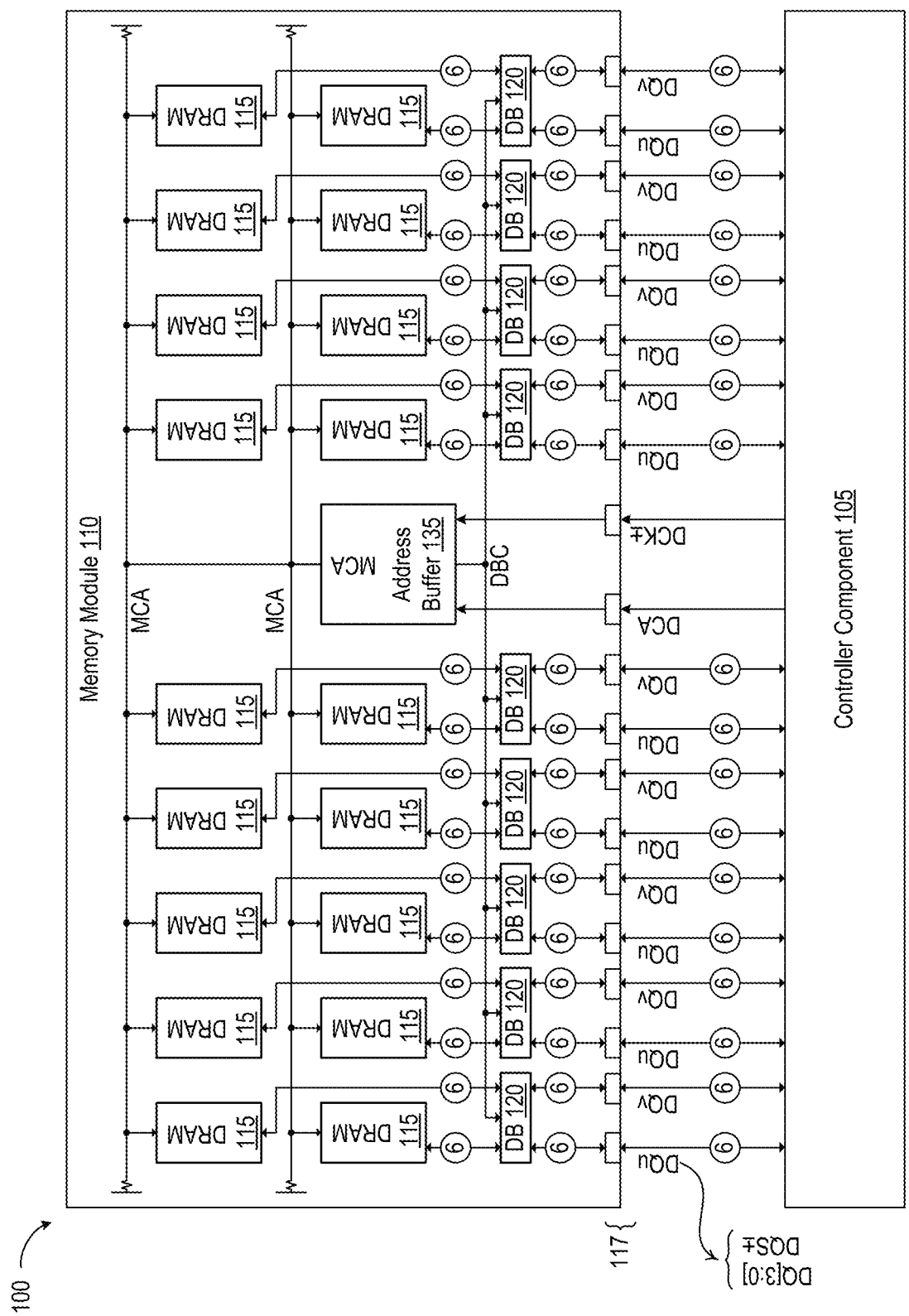
FIG. 1B depicts memory system 100 of FIG. 1 with a full complement of memory components 115 in accordance with one embodiment.

FIG. 1B depicts memory system 100 of FIG. 1 with a full complement of memory components 115 in accordance with one embodiment. Module 110 communicates nine eight-bit data bytes (72 data bits) in parallel. Module 110 includes a printed-circuit board with e.g. at least eighteen memory components 115 on one or each side of the board. Each memory component 115 may include multiple DRAM dies, or multiple DRAM stacked packages. Each memory component 115 communicates parallel data that is four bits wide (×4, or a "nibble"), though different data widths and different numbers of components and dies can be used in other embodiments. Module 110 also includes nine data-buffer components 120, or "data buffers," each of which communicates data to and from two memory components 115 via respective ×4 data channels, each channel accompanied by a complementary strobe signal that times the transmission and receipt of data signals.

Each of the nine data-buffer components 120 communicates eight-wide data for a total of 72 data bits. In general, N*64 data bits are encoded into N*72 signals, where N is an integer larger than zero (in modern systems, N is usually 1 or 2), where the additional N*8 data bits allow for error detection and correction. For example, a form of ECC developed by IBM and given the trademark Chipkill™ can be incorporated into module 110 to protect against any single memory die failure, or to correct multi-bit errors from any portion of a single memory die. ECC support is omitted in other embodiments.

Module 110 is illustrative and not limiting. A memory module in accordance with another embodiment, for example, supports DRAM memory specification called Double Data Rate 5 Synchronous Dynamic Random-Access Memory (DDR5 SDRAM). The DDR5 SDRAM module includes two forty-bit sub-channels for a total of eighty bits. Each sub-channel conveys thirty-two bits of data and eight bits of error-correcting code (ECC) and is directed by a respective secondary control interface and a respective data-buffer control interface from a common address buffer. With reference to FIG. 1B, in a DDR5 module one sub-channel would be to the left of address buffer 135 the other to the right, each with separate module control interfaces. The left and right sub-channels would each have e.g. five data buffers 120 and ten DRAM components 115.

Figure 2:
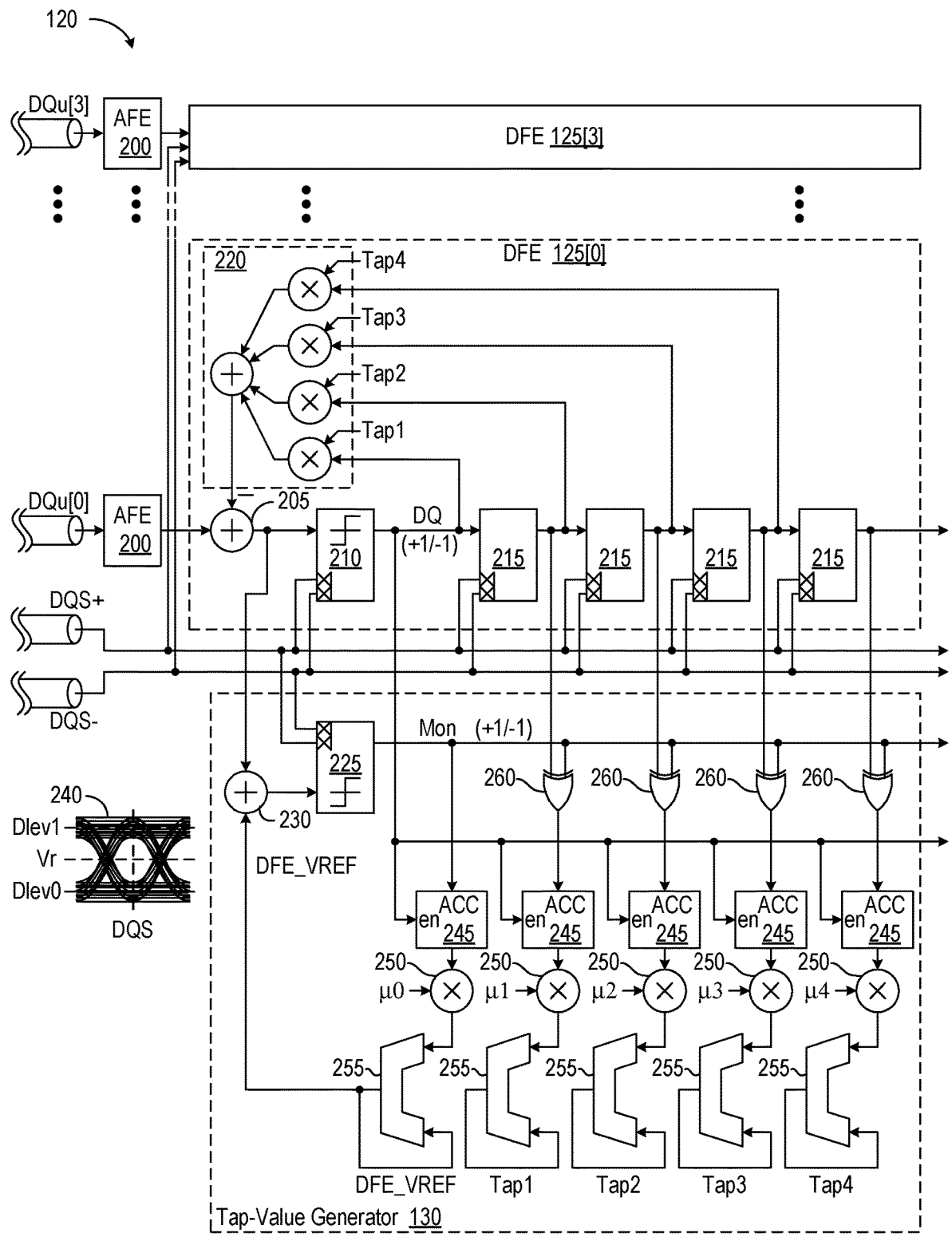
FIG. 2 depicts a portion of a data buffer 120 in accordance with one embodiment, detailing one DFE 125[0], the one to receive data via link DQu[0] (FIGS. 1A and 1B) and a tap-value generator 130.

FIG. 2 depicts a portion of a data buffer 120 in accordance with one embodiment, detailing one DFE 125[0], the one to receive data via link DQu[0] (FIGS. 1A and 1B) and a tap-value generator 130. Tap values Tap[4:1] generated by tap-value generator 130 are unique to DFE 125[0] but can be shared by between two or more DFEs in other embodiments. An analog front-end (AFE) 200, one for each DFB, preconditions the incoming signal using e.g. a feed-forward equalizer that exhibits frequency-dependent gain that approximates the inverse of the frequency-dependent response of the incoming channel (e.g., the linking conductor and associated circuit elements). Signal paths and related components typically exhibit a low-pass filter effect, in which case equalizer AFE 200 may be used to compensate for attenuation of higher-frequency signal components.

The AFE 200 for signal DQu[0] feeds a preconditioned version of this input to a summing node 205 in DFE 125[0] Summing node 205 subtracts feedback from the incoming signal and presents the resultant difference signal to a main sampler 210 that samples the signal on its input port timed to edges of strobe signal DQS±. Strobe edges are temporally aligned, during training, with the symbols represented by the changing signal DQu[0]. Sampler 210 compares the voltage of each symbol on its input port with a reference voltage and outputs a resultant binary value. Using a zero-volt reference level, for example, a symbol with a voltage above zero is sampled as +1 and below zero as −1. The input signals are binary in this example. Binary values are represented as ± 1 rather than 0 or 1 because the incoming signal is expressed as an analog voltage centered around zero volts. Other embodiments employ more or different signal levels and concomitant reference values.

Sampler 210 and a sequence of sequential storage elements 215 present four prior samples (taps), each representing a logic 0 (−1) or a logic 1 (+1), to a feedback network 220 that multiplies each tap by a corresponding one of tap values Tap[4:1] and presents the sum of the resultant products to summing node 205 to be subtracted from the incoming signal. If, for example, the most-recent symbol—the output of sampler 210—is known to have interfered with the current symbol—the input to sampler 210—by either plus or minus 0.1 volts, depending on the value of the prior symbol, tap value Tap1 can be set to 0.1 volts so that node 205 subtracts the inter-symbol interference of the most-recent symbol from the current symbol. The remaining taps can likewise counter inter-symbol interference produced by the symbols represented by their captured samples.

Signal DQu[0] propagates from the memory controller through the data channel. The distortion of signal DQu[0] is thus a measure of the frequency-dependent distortion of the channel that is unaccounted for by AFE 200 and distortion due to signal reflection in the channel. Ideally, the equalized version of signal DQu[0] presented to the input of sampler 210 would perfectly represent the symbols binary one (+1) and binary zero (−1) for capture by the sampler. Any variation from this ideal represents an error across sampler 210. Tap-value generator 130 arrives at tap values Tap[4:1] that, applied to DFE 125[0], minimizes the least-mean squared (LMS) measure of this error using a sign-sign LMS algorithm.

Tap-value generator 130 includes a monitor sampler 225 that probes the equalized signal from summing node 205 for errors and circuitry that derives tap values Tap[4:1] from those errors. Tap-value generator 130 thus calibrates DFE 125[0] to account for channel-specific inter-symbol interference for signal DQu[0]. Tap values Tap[4:1] can be shared with DFEs that sample signals DQu[3:1] if the respective channels have similar frequency-dependent and reflection responses, or additional instances of tap-value generator 130 can be used for each DFE or for larger or smaller sets of DFEs.

Tap-value generator 130 receives the equalized version of signal DQu[0] from summing node 205. An eye diagram 240 illustrates a symbol period (the "eye") of an incoming data signal with a sample instant DQS centered within the eye along a time axis and a voltage reference Vr centered on a voltage-amplitude axis. High and low "fuzz bands" centered on respective data levels Dlev1 and Dlev0 represent the ranges of high and low values that express digital one and zero symbol values impacted by inter-symbol interference. For example, a positive symbol level representative of a logic one is likely to be of a lower than ideal voltage if the preceding symbols were negative rather than positive. DFE 125[0] reduces the impact of prior symbol levels to narrow the fuzz bands and open the symbol eye, thus increasing sample error margins in time and voltage.

The following discussion details how address buffer 135 calibrates itself and data buffers 120 without unduly burdening host controller component 105. Controller component 105 initiates calibration, in one example, by issuing an instruction to address buffer 135 to begin calibration. Address buffer 135 responsively prepares DFEs 137 and tap-value generators 140 for calibration. Controller component 105 then transmits pseudo-random bit sequences in lieu of command and address signals and in the company of timing-reference signals as detailed above. Once address buffer 135 has completed its calibration, controller component 105 issues an instruction to address buffer 135 to calibrate data buffers 120. Address buffer 135 enables data buffers 120 and controller component 105 transmits pseudo-random bit sequences or bursts of "dummy" write data to data buffers 120.

In receipt of strobe and pseudo-random data, tap-value generator 130 calibrates a feedback signal DFE_VREF to summing node 230 that offsets the incoming equalized version of data signal DQu[0] by the upper data level Dlev1. Let us assume that signal DFE_VREF is initially zero such that the inputs to data sampler 210 and monitor sampler 225 are essentially identical and the binary symbol values for signals DQ and Mon are consequently the same. An accumulator 245 (the leftmost of five such circuits) is enabled each time signal DQ expresses a logic one (+1). When signal DQ is logic one (+1), accumulator 245 increments; when signal DQ is logic zero (−1), accumulator 245 decrements. Accumulator 245 starts at zero in one embodiment, incrementing as high as sixteen or as low as negative sixteen before producing a positive or negative output (+1 or −1). Accumulator 245 thus accumulates a measure of similarity between the series of data samples DQ and the series of monitor samples Mon as a function of the displacement of the monitor samples relative to the data samples. A multiplier 250 multiplies the output from accumulator 245 by a fixed or programmable step size μ0. A simple arithmetic logic unit (ALU) 255 holds a current value of an offset voltage DFE_VREF until prompted by positively or negatively saturated accumulator 245 to add the output from multiplier 250 to the current value of DFE_VREF.

The reader will recall that signal DFE_VREF was initially set to zero in this example so symbols DQ and Mon will initially be the same. The leftmost accumulator will initially increment each time signals DQ and Mon are +1, and each time the accumulator reaches sixteen signal level DFE_VREF will rise by an amount set by step size μ0. Signal level DFE_VREF will continue to rise until signal Mon is negative as often as it is positive, which indicates that monitor sampler 225 is sampling in the middle of the higher fuzz band.

The foregoing discussion of the calibration of level DFE_VREF ignores the action of the remaining circuitry within tap-value generator 130, the action of which can proceed concurrently. Each of tap values Tap[4:1] is generated using adaptive feedback similar to what was applied for the calibration of signal DFE_VREF. An exclusive OR gate 260 for each tap in DFE 125[0] compares monitor signal Mon to the symbols on the corresponding tap. The four accumulators 245 associated with the filter taps are each enabled when the symbol on signal DQ is +1. The data and monitor samples DQ and Mon represent the signs of the sampled values. XOR gates 260 have the effect of multiplying these signs and presenting the resultant product to accumulators 245. Recalling that +1 and −1 represent binary 1 and 0, respectively, the output of XOR gate will be negative (logic zero) when DQ≠Mon and positive (logic one) when DQ=Mon. Each accumulator 245 is "enabled" when sample DQ is outputting a logic 1 (or +1). When enabled, each accumulator 245 is induced to increment when the signal on its input node is asserted (logic 1). If the monitor samplers tend to be biased toward "1"s when Tap[#] is "1", the Tap weight will be adjusted to make the sampling threshold higher when Tap[#] is "1", making the sampler outputs more likely to be "0". Over time, tap-value generator 130 will cause tap values Tap[4:1] to converge in parallel to a set of coefficients that produce the least mean square of the error between the input and output of data sampler 210. At the time of convergence, the tap data is effectively uncorrelated from the residual error represented by signal Mon from monitor sampler 225.

Accumulators 245 are filters that smooth out noise. When enough positive or negative "sign-sign" products accumulate for a given tap, the corresponding multiplier 250 and ALU 255 update the corresponding tap value. Each ALU 255 thus performs a long-term average of the scaled result from a corresponding accumulator 245. This process continues until the tap value converges at or near an optimum. In this embodiment, accumulators 245 are only enabled when signal DQ is +1, corresponding to a high data level, and thus prevent tap-value updates for low data levels. Other embodiments can include a second monitor sampler and related circuitry to generate a monitor signal when signal DQ is −1 and update the tap values using this additional information.

The algorithm can begin with an assumption of small weights (e.g. zero) and gradually converges to the calibrated values over time with training data. Calibrated tap values can be stored for later use. Tap weights can be initialized with such stored values, or with values otherwise expected for a given system, to greatly reduce the time required for tap-value convergence. During operation, tap-value generator 130 can be always active or can be enabled periodically to account for changes in supply voltage and temperature, which tend to change on a time scale that is exceedingly long relative to a symbol period. In some embodiments, a host (e.g. memory controller) issues an adaptation command to activate tap-value generator 130 in advance of training strobe and data signals.

Figure 3:
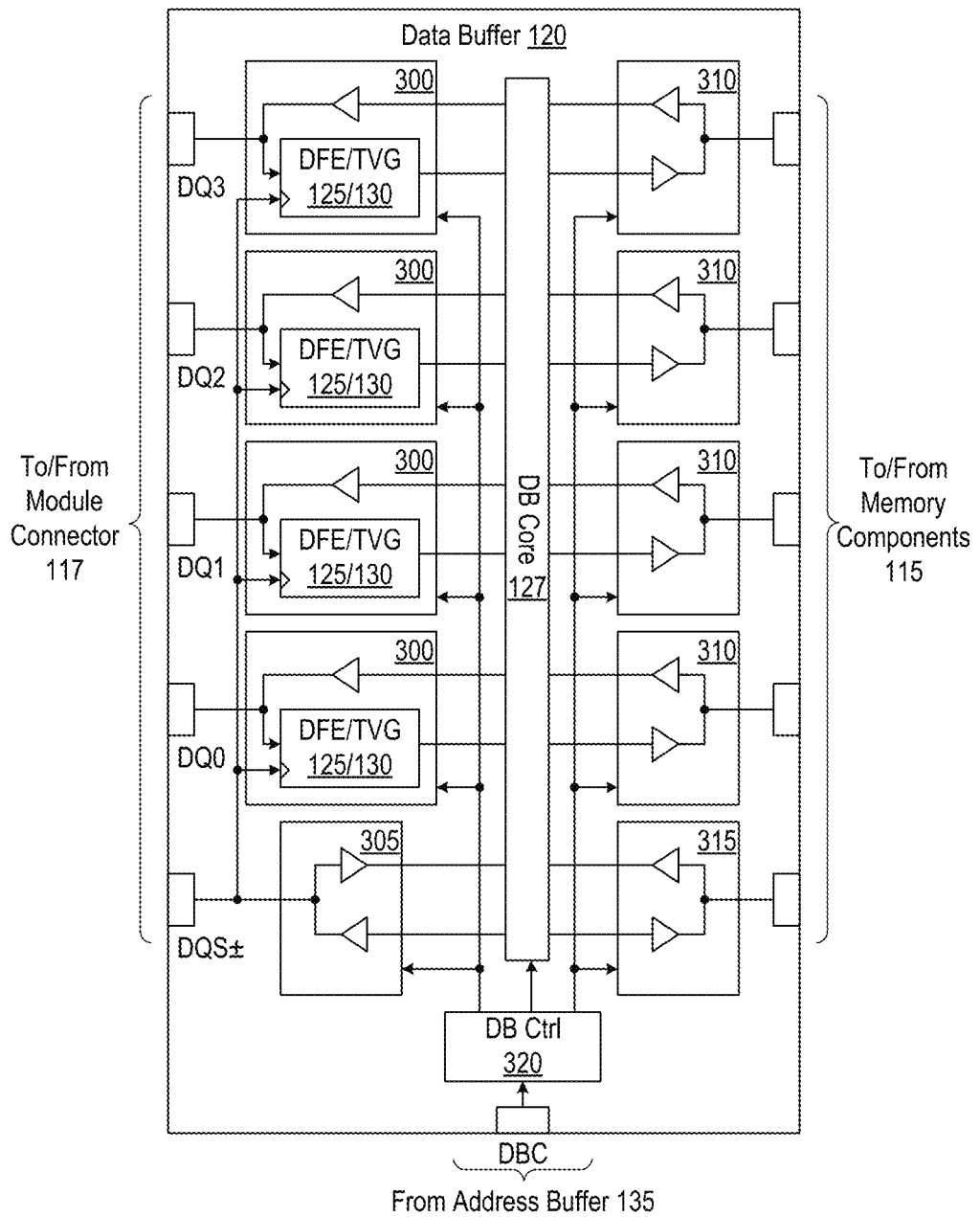
FIG. 3 illustrates a data buffer 120 in accordance with one embodiment.

FIG. 3 illustrates a data buffer 120 in accordance with one embodiment. Only four of eight data paths and one of two strobe paths are shown. On the left, a controller interface includes four bidirectional data interfaces 300 and a bidirectional strobe interface 305. On the right, a DRAM interface similarly includes four bidirectional data interfaces 310 and a bidirectional strobe interface 315. A data-buffer controller 320 issues control signals to these circuit elements responsive to data-buffer-control signals DBC from the address buffer.

Each data interface 300 includes, for write data, an instance of a DFE 125 and tap-value generator 130 as detailed in connection with FIG. 2. Tap-value generation can be shared among two or more DFEs in other embodiments. Write data and accompanying strobe signals are conveyed to interfaces 310 and 315, which transmit them to DRAM. In the read direction, interfaces 310 and 315 receive data and strobe signals from a selected memory die and convey those signals to respective interfaces 300 and 305. DFEs are not included on the memory side of buffer 120 because the loading and noise experienced by signals on the module are lower than for those that leave the module. Data-buffer controller 320 manages power consumption by selectively enabling read and write components, directs DFE training, and the like.

Figure 4:
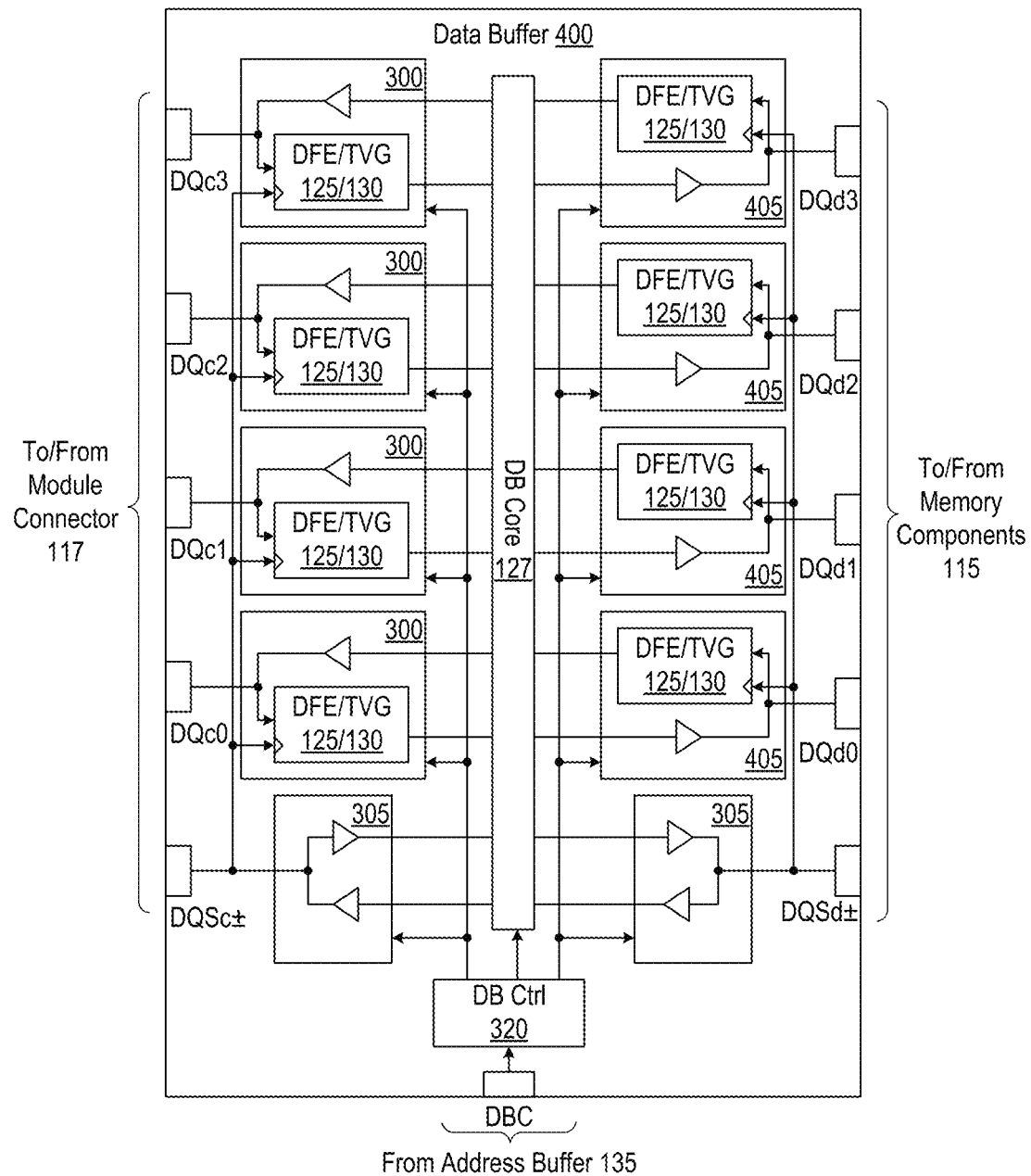
FIG. 4 illustrates a data buffer 400 in accordance with another embodiment.

FIG. 4 illustrates a data buffer 400 in accordance with another embodiment. Data buffer 400 is similar to data buffer 120, supra, with like-identified elements being the same or similar. Data buffer 400 differs from earlier embodiments in that the interface circuitry to memory components 115 includes bidirectional data interfaces 405 that each include a DFE, 125 and a tap-value generator 130 that can be of the type detailed previously. Interfaces 405 can be different from interfaces 300 to account for e.g. different noise and loading associated with module connectors 115 and 117. For example, the DFEs on the memory side may have fewer taps than the DFEs on the controller side if the loading and noise experienced by signals on module connector 117 are greater than for signals to and from the memory components. The memory components are adapted to issue training data, e.g. PRBSs, to calibrate data interfaces 405.

Figure 5:
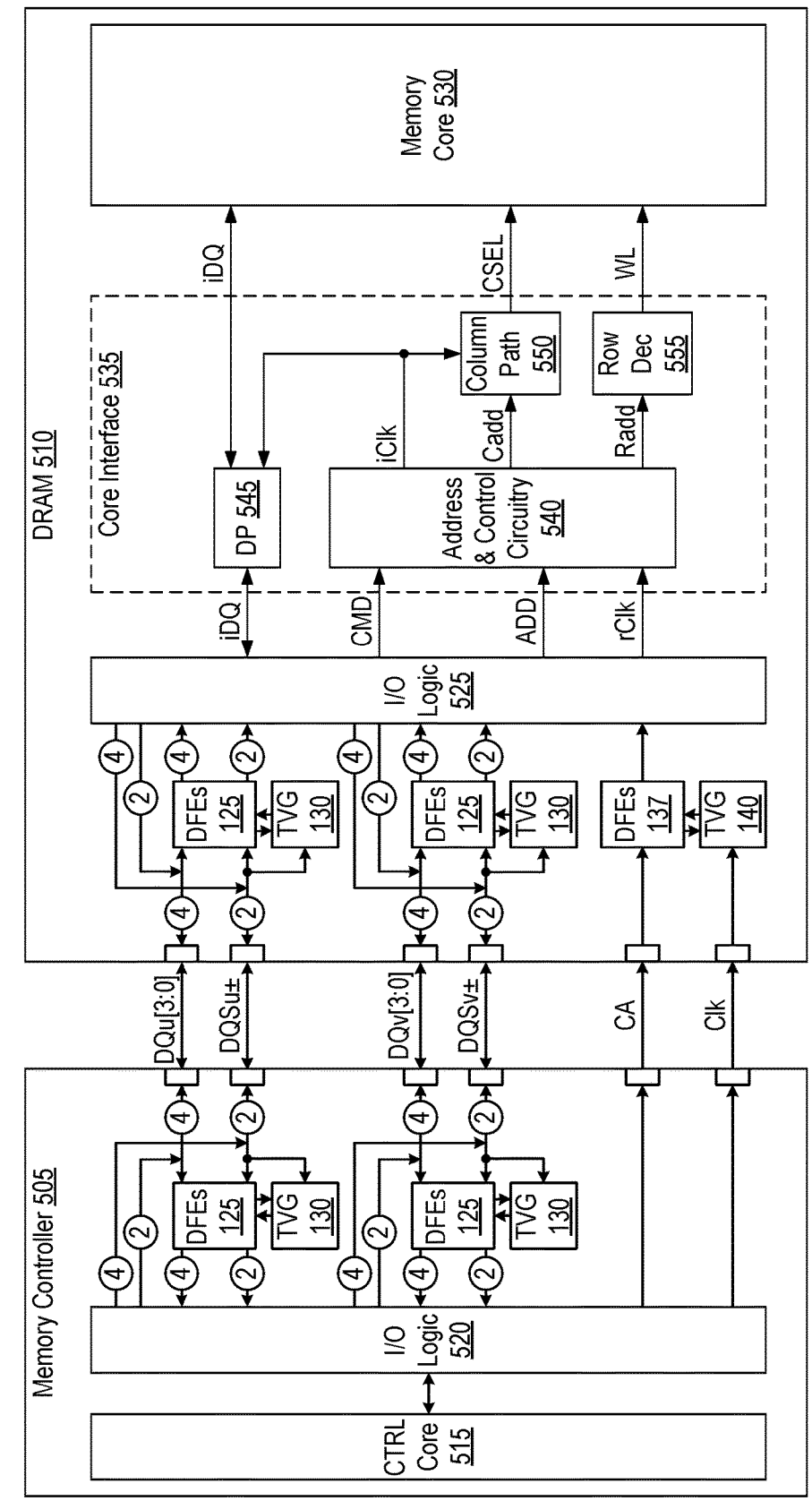
FIG. 5 illustrates a memory system 500 in which both a memory-controller component 505 and a memory component 510 include DFEs 125 and tap-value generators 130 to support robust, high-speed communication between integrated-circuit components.

FIG. 5 illustrates a memory system 500 in which both a memory-controller component 505 and a memory component 510 include DFEs 125 and tap-value generators 130 to support robust, high-speed communication between integrated-circuit components. A central-processing unit (CPU), not shown, issues requests to controller component 505 to store and retrieve data from memory component 510, a DRAM die in this example. Controller component 505 is a digital circuit that manages the flow of data going to and from DRAM 510 using some control logic 515 and input/output (I/O) logic 520.

DRAM 510 includes I/O logic 525, a memory core 530 to store and provide data, and a core interface 535 to manage the flow of signals between I/O interface 525 and memory core 530 that includes e.g. sense amplifiers and an array of memory cells (not shown). Core interface 535 includes address and control circuitry 540, a datapath 545, a column path 550, and a row decoder 555. Control circuitry 540 decodes commands CMD from controller 505 to perform a number of memory operations, such as reads and writes. Memory operations are directed to specific addresses received on address bus ADD, and operations performed by core interface 535 are timed relative to a reference clock rClk received or derived from the clock signal CLK from memory controller 505. The reference clock can come from elsewhere in other embodiments. Data signals are conveyed between controller component 505 and memory component 510 in both directions with an accompanying strobe signal. Each of controller component 505 and memory component 510 is adapted to issue training data, e.g. PRBSs, to the other component in support of DFE calibration. Likewise, a data buffer intermediating between memory controller 505 and memory component 510 could receive training data from both and issue training data to both.

While the present invention has been described in connection with specific embodiments, after reading this disclosure variations of these embodiments will be apparent to those of ordinary skill in the art. For example, some or all of the functionality of data-buffer components can be integrated into the packaging or devices of memory components 115, or into address-buffer component 135; and data and/or command and address signals can be sampled on alternating adjacent clock or strobe edges (i.e., single data-rate or double-data rate sampling). Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. For applications filed in the United States, only those claims specifically reciting "means for" or "step for" should be construed in the manner required under the sixth paragraph of 35 U.S.C. § 112.

We claim:

1. A signal receiver to sample a plurality of digital signals conveyed in parallel from a memory controller and timed to a timing-reference signal from the memory controller, the signal receiver comprising:
   a plurality of decision-feedback equalizers, each decision-feedback equalizer including:

a sampler having a sampler input port to receive a respective one of the plurality of digital signals conveyed in parallel from the memory controller;
a tap port to receive a respective equalizer-tap value; and
a timing port to receive the timing-reference signal from the memory controller;
each decision-feedback equalizer to equalize the respective digital signal on the sampler input port responsive to the respective equalizer-tap value; and
an adaptive tap-value generator coupled to the tap port of one of the decision-feedback equalizers, the adaptive tap-value generator including a monitor sampler, to produce monitor samples of the digital signal to the one of the decision-feedback equalizers, and to generate the respective equalizer-tap value for the one of the decision-feedback equalizers as a function of least-mean squares of errors at the sampler input port of the one of the decision-feedback equalizers;
wherein the digital signals are binary signals, the adaptive tap-value generator generating the equalizer-tap values for the one of the decision-feedback equalizers as a function of the errors for only one of two levels of the digital signal.

2. The signal receiver of claim 1, wherein the digital signals conveyed in parallel from the memory controller represent data for storage in a memory.

3. The signal receiver of claim 1, wherein the digital signals conveyed in parallel from the memory controller comprise at least one of command signals and address signals.

4. The signal receiver of claim 1, wherein the adaptive tap-value generator is coupled to the tap port of more than one of the decision-feedback equalizers.

5. The signal receiver of claim 1, further comprising a plurality of analog front ends, one for each of the plurality of decision-feedback equalizers, for equalizing the respective digital signals to the decision-feedback equalizers.

6. The signal receiver of claim 1, wherein the timing-reference signal comprises a strobe signal.

7. An integrated circuit for receiving digital signals conveyed in parallel from a memory controller and timed to a timing-reference signal from the memory controller, the integrated circuit comprising:
a plurality of decision-feedback equalizers, each decision-feedback equalizer including a sampler having a sampler input port to receive a respective one of the plurality of digital signals conveyed in parallel from the memory controller, a tap port to receive a respective equalizer-tap value, and a timing port to receive the timing-reference signal from the memory controller, each decision-feedback equalizer to equalize the respective digital signal responsive to the respective equalizer-tap value; and
an adaptive tap-value generator coupled to the tap port of one of the decision-feedback equalizers, the adaptive tap-value generator including a monitor sampler, to produce monitor samples of the digital signal to the one of the decision-feedback equalizers, and to generate the respective equalizer-tap value for the one of the decision-feedback equalizers as a function of least-mean squares of errors to the sampler input port of the decision-feedback equalizer;
wherein the digital signals are binary signals, the adaptive tap-value generator generating the equalizer-tap values for the one of the decision-feedback equalizers as a function of the least-mean square of error for only one of two levels of the digital signal to the one of the decision-feedback equalizer.

8. The integrated circuit of claim 7, wherein the digital signals conveyed in parallel from the memory controller represent data for storage, the integrated circuit further comprising an array of memory cells to store the data.

9. The integrated circuit of claim 8, further comprising an output port to convey the equalized digital signals from the integrated circuit.

10. The integrated circuit of claim 9, wherein the output port connects the integrated circuit to a control interface of a memory component.

11. The integrated circuit of claim 9, wherein the output port connects the integrated circuit to a data interface of a memory component.

12. The integrated circuit of claim 7, wherein the adaptive tap-value generator is coupled to the tap port of more than one of the decision-feedback equalizers.

13. The integrated circuit of claim 7, further comprising a plurality of analog front ends, one for each of the plurality of decision-feedback equalizers, for equalizing the respective digital signals to the decision-feedback equalizers.

14. The integrated circuit of claim 7, wherein the timing-reference signal comprises a strobe signal.

15. A memory module comprising:
a module connector to receive data signals, a data-timing signal, address signals, and an address-timing signal from a memory controller;
a data-buffer component coupled to the module connector to receive the data signals and the data-timing signal, the data-buffer component including:
a plurality of decision-feedback equalizers, each decision-feedback equalizer including a sampler having a sampler input port to receive a respective one of the data signals conveyed in parallel from the memory controller, a tap port to receive a respective equalizer-tap value, and a timing port to receive the data-timing signal from the memory controller, each decision-feedback equalizer to equalize the respective data signal responsive to the respective equalizer-tap value; and
an adaptive tap-value generator coupled to the tap port of one of the decision-feedback equalizers, the adaptive tap-value generator including a monitor sampler, to produce monitor samples of the data signal to the one of the decision-feedback equalizers, and to generate the respective equalizer-tap value for the one of the decision-feedback equalizers as a function of least-mean squares of errors to the sampler input port of the decision-feedback equalizer;
an address-buffer component coupled to the module connector to receive the address signals and the address-timing signal from the memory controller, the address-buffer component including an address-output port to relay the address signals; and
a memory component having an array of memory cells, a memory-component data port coupled to the decision-feedback equalizers to receive the equalized data signals, and a memory-component address port coupled to the address-buffer component to receive the relayed address signals.

16. The memory module of claim 15, the address-buffer component further including a second plurality of decision-feedback equalizers to equalize the address signals received from the memory controller.

17. The memory module of claim 16, the address-buffer component further including a second adaptive tap-value generator coupled to at least one of the second plurality of decision-feedback equalizers, the second adaptive tap-value generator to generate a second equalizer-tap value as a function of least-mean squares of the errors.

18. The memory module of claim 15, wherein the data-timing signal comprises a strobe signal, the address-timing signal comprises a clock signal that oscillates during times when the strobe signal is inactive.

* * * * *